(12) United States Patent  
Wilson et al.

(10) Patent No.: US 8,321,490 B2  
(45) Date of Patent: Nov. 27, 2012

(54) INSTRUCTION-BASED PARALLEL MEDIAN FILTERING

(75) Inventors: James Wilson, Foxboro, MA (US); Joshua A. Kablotsky, Carlisle, MA (US); Yosef Stein, Sharon, MA (US); Gregory M. Yukna, Norton, MA (US)

(73) Assignee: Analog Devices, Inc., Norwood, MA (US)

(*) Notice: Subject to any disclaimer, the term of this patent is extended or adjusted under 35 U.S.C. 154(b) by 754 days.

(21) Appl. No.: 12/554,500

(22) Filed: Sep. 4, 2009

(65) Prior Publication Data

US 2009/0327378 A1    Dec. 31, 2009

Related U.S. Application Data

(63) Continuation-in-part of application No. 11/191,513, filed on Jul. 28, 2005, now abandoned.

(51) Int. Cl.  
*G06F 17/10* (2006.01)  
*G06F 7/00* (2006.01)

(52) U.S. Cl. ........................................ 708/304; 708/207

(58) Field of Classification Search .................. 708/304, 708/207  
See application file for complete search history.

(56) References Cited

U.S. PATENT DOCUMENTS

| 4,597,009 A | 6/1986 | Ballmer et al. |
| 4,970,637 A | 11/1990 | Sato |
| 5,097,263 A | 3/1992 | Delpech et al. |
| 5,319,583 A | 6/1994 | Wildes |
| 5,737,251 A | 4/1998 | Kohno et al. |
| 7,403,666 B2 | 7/2008 | Arata |
| 2002/0073126 A1 | 6/2002 | Kim |
| 2003/0033336 A1 | 2/2003 | Gremmert |
| 2005/0100238 A1 | 5/2005 | Arata |

FOREIGN PATENT DOCUMENTS

| WO | WO-90/01750 | 2/1990 |
| WO | WO-99/36845 | 7/1999 |

OTHER PUBLICATIONS

Search Report for European Patent Application No. 06787441.2, mailed Sep. 22, 2009, 7 pages.  
English translation of Office Action for Japanese Patent Application No. 2008-523935, mailed Jun. 15, 2010, 4 pages.

*Primary Examiner* — Tan V. Mai  
(74) *Attorney, Agent, or Firm* — Bingham McCutchen LLP

(57) ABSTRACT

An instruction-based parallel median filtering processor and method sorts in parallel each combination of pairs of inputs into greater and lesser values; determines from that sorting the minimum, maximum and median filter values of the inputs; processes one of those values and provides the processed value as an input; and applies an instruction for providing one of the values to the processing step, and at least one other instruction for enabling indication of at least one of the maximum, minimum, median filter values.

13 Claims, 10 Drawing Sheets

| $p^1 > p^2$ | $p^1 > p^3$ | $p^2 > p^3$ | Min  Med  Max |
|---|---|---|---|
| ✓ | ✓ | ✓ | p3, p2, p1 |
| ✓ | ✓ | — | p2, p3, p1 |
| ✓ | — | ✓ | — |
| ✓ | — | — | p2, p1, p3 |
| — | ✓ | ✓ | p3, p1, p2 |
| — | ✓ | — | — |
| — | — | ✓ | p1, p3, p2 |
| — | — | — | p1, p2, p3 |

INSTRUCTION-BASED PARALLEL MEDIAN FILTERING

RELATED APPLICATIONS

This application is a continuation-in-part of co-pending U.S. patent application Ser. No. 11/191,513, filed Jul. 28, 2005, which is hereby incorporated by reference herein in its entirety.

FIELD OF THE INVENTION

This invention relates to an instruction-based parallel median filtering processor and method.

BACKGROUND

Median filtering is a non-linear signal-enhancement technique for the smoothing of signals, the suppression of impulse noise, and preserving of edges. It involves sliding a window having an odd number of elements along the signal and replacing the center sample by the median of the samples in the window. The median value m of the samples in a window is the value for which half of the samples in the window have smaller values than m and the other half have values greater than m. In a one-dimensional median filter having three samples $P_1$, $P_2$, $P_3$, the median value is found by sorting the three samples and selecting the midpoint as the median. In the straightforward approach $P_2$ is compared to $P_3$ in the first stage; the minimum of that is compared to $P_1$ in the second stage; and the minimum of the second stage is the minimum value $P_{MIN}$. In the third stage the maximum output of the second stage is compared to the maximum of the first stage. The maximum output of the third stage is the maximum value $P_{MAX}$ and the minimum output of the third stage is the median value $P_{MED}$.

One shortcoming of this approach is that the three stages operate sequentially; it requires three cycles of operation to obtain the median. Another problem is that each sort operation (finding the min and max between two samples) is dependent on the result of the previous operation which, in a deeply pipelined machine, would cause pipeline stall: the pipeline would stop, waiting for the offending instruction to finish, before execution resumes. A fully parallel solution that mitigates the multiple sequential operation problem uses a dedicated ASIC, but this approach entails additional limited-functionality hardware which permanently accompanies the device (e.g., a DSP chip) even though it may be only occasionally needed. Attempts to apply within the device a parallel solution optimized for multiply-accumulate actions (as occur in FIR and FFT operations) has not been pursued because, in a typical device utilizing median filters, the compute-unit result bus has only half the width of the input bus. This is because in multiplication of two N-bit numbers, the result being stored to memory is one number of N bits; but in median filters, the inputs are merely sorted, which results in the same number of outputs.

Additionally, conventional median filters only process new samples and do not include any feedback path to receive a filter-processed sample back as an input for additional or refined filtering.

SUMMARY

It is therefore an object of this invention to provide an improved instruction-based parallel median filtering processor and method.

It is a further object of this invention to provide such a improved instruction-based parallel median filtering processor and method which is faster than conventional median filters.

It is a further object of this invention to provide such an improved instruction-based parallel median filtering processor and method which is compatible with conventional two-input, one-output filtering core unit bus structures.

It is a further object of this invention to provide such an improved instruction-based parallel median filtering processor and method which decomposes three-tap median filters into two parallel independent instructions.

It is a further object of this invention to provide such an improved instruction-based parallel median filtering processor and method which removes pipeline dependency between the decomposed instructions.

It is a further object of this invention to provide such an improved instruction-based parallel median filtering processor and method which can employ the existing hardware components of a traditional processor.

In one aspect of the invention, a processor with instruction-based parallel median filtering includes a filtering core unit, and a program sequencer. The filtering core unit receives a plurality of inputs and includes a core-resident comparing circuit, a core-resident decision circuit, and a core-resident processing circuit. The core-resident comparing circuit sorts in parallel each combination of pairs of inputs into greater and lesser members; the core-resident decision circuit, responsive to the sorting of the pairs of inputs, determines the minimum, maximum and median filter values of the inputs; and the core-resident processing circuit processes one of the minimum, maximum and median filter values and provides the processed value as a core unit input. The program sequencer provides a first instruction for causing the core-resident decision circuit to provide one of the minimum, maximum and median filter values to the core-resident processing circuit, a second instruction for causing the core-resident decision circuit to indicate at least one of those values at a core unit output, and a third instruction for causing the core-resident decision circuit to indicate the others of those values at the output. The program sequencer causes the core-resident decision circuit to execute the second and third instructions after the processed value has been provided to the filtering core unit.

In one embodiment, the filtering core unit further includes a memory unit to store the input values and at least one of the minimum, maximum and median filter values. The comparing unit may include a comparator circuit for comparing each pair of the inputs. The comparator circuit may include a subtractor circuit for subtracting each pair of inputs, and the greater and lesser members of each pair may be indicated by the sign of their difference. In some embodiments, the decision circuit includes a logic circuit responsive to the pattern of signs of the differences to indicate the median filter value. In some embodiments, the decision circuit includes a logic circuit responsive to the pattern of signs of the differences to indicate the maximum, minimum and median filter values. The program sequencer instructions may be independent of a structural pipeline of the filtering core unit. There may be three inputs.

In another aspect of the invention, a method of instruction-based parallel median filtering in a filtering core unit of a processor includes sorting, in the core unit, in parallel each combination of pairs of inputs into greater and lesser values; determining, in the core unit, from that sorting the minimum, maximum and median filter values of the inputs; and processing, in the core, one of the minimum, maximum and median filter values and providing the processed value as an input to the sorting step. A first instruction may be applied for providing one of the minimum, maximum and median filter values to the processing step. A second may be applied for enabling indication of at least one of those values, and a third instruction may be applied for enabling indication of the others of those values. The second and third instructions may be applied after the processed value has been provided for sorting.

In one embodiment, the method further comprise storing, in the core, the inputs and at least one of the minimum, maximum and median filter values. There may be three inputs.

BRIEF DESCRIPTION OF THE DRAWINGS

Other objects, features and advantages will occur to those skilled in the art from the following description of a preferred embodiment and the accompanying drawings, in which.

DESCRIPTION OF THE INVENTION

Figure 1:
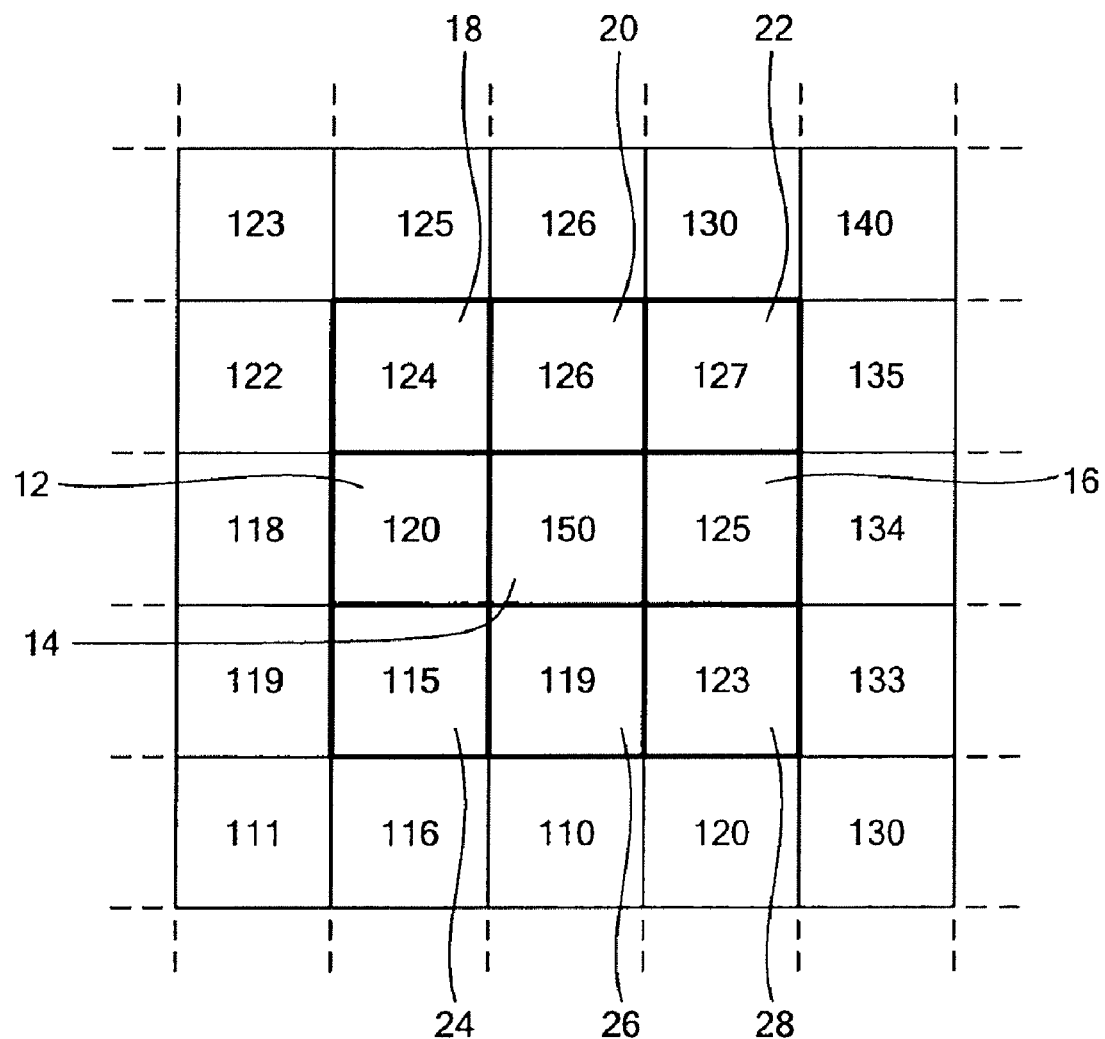
FIG. 1 is an enlarged schematic view of an area of pixels to be median filtered.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a portion of an image 10 whose pixels are to be median-filtered. For example, assuming a neighborhood or window of three pixels 12, 14 and 16, representing a one-dimensional signal whose values are respectively 120, 150, and 125, the median value is 125, the minimum value is 120 and the maximum is 150. Consider now a two-dimensional signal including pixels 12, 14 and 16 as well as pixels 18, 20, 22 and pixels 24, 26, and 28. This is now a window or a neighborhood of nine values, namely, 115, 119, 120, 123, 124, 125, 126, 127 and 150. Clearly here the median value is 124, the minimum 115, and the maximum 150.

Figures 2, 3:
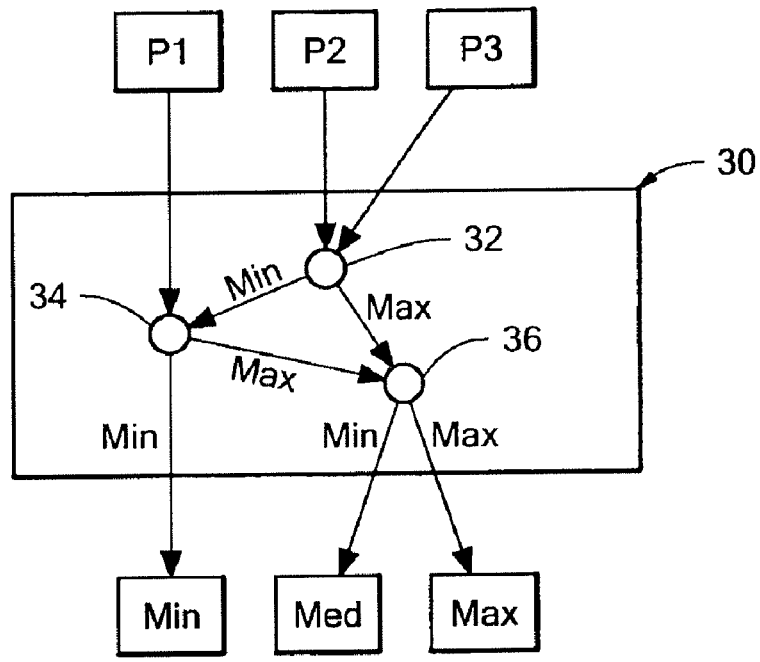
FIG. 2 is a schematic diagram of a prior art three input median filter.
FIG. 3 is a truth table of the eight possible patterns of Max, Med, Min for a three input median filter.

Conventional median filters, such as median filter 30 shown in FIG. 2, having three input taps for receiving inputs $P_1$, $P_2$, and $P_3$, and typically include three logic stages or nodes 32, 34, and 36 to obtain three outputs Min, Med, and Max. Node 32 first compares inputs $P_2$ and $P_3$ to determine the Min and the Max. The result is delivered to node 34, where it is compared with input $P_1$ so that node 34 determines the Min, which it outputs; the Min, together with the Max output from node 32, is now processed by node 36. The Max output of node 36 is the Max output of the filter, and the Min output of node 36 is the Med output of the filter. One problem with this conventional approach is that it takes three cycles of operation. Node 34 cannot operate until it receives the results from the operation of node 32; node 36 cannot operate until it receives the results of the operations of node 34 and node 32.

In accordance with embodiments of the present invention, it is understood that with a fixed number of inputs (for example, three), there will be a predictable number of sort patterns of inputs, $P_1$, $P_2$, and $P_3$ occupying the positions of Min, Med, and Max. This can be shown in the truth table of FIG. 3, which contains three columns, 38, 40 and 42, representing the three comparison combination pairs, $P_1>P_2$, $P_1>P_3$ and $P_2>P_3$ that can occur with three inputs. With three inputs there are eight possible combinations; a check mark in one of columns 38, 40, 42 indicates the truth of the proposition at the top of the column. For example, in the first row there are all checks because in this case all propositions are true, i.e., it is true that $P_1$ is greater than $P_2$, it is true that $P_1$ is greater than $P_3$ and it is true that $P_2$ is greater than $P_3$. When all three of those conditions are true, $P_3$ will be the Min, $P_2$ the Med and $P_1$ the Max as shown in column 44. In the next row down column 38 and 40 have a check, column 42 has a dash; the dash means that $P_2$ is not larger than $P_3$, but rather, $P_3$ is larger than $P_2$. In that condition, then, where $P_1$ is larger than $P_2$, $P_1$ is larger than $P_3$ and $P_2$ is not larger than $P_3$, the Min, Med, Max outputs indicated in column 44 are $P_2$, $P_3$, and $P_1$, respectively, and so on through the eight possible combinations of the three conditions. The decision column 44 shows that not all eight possible combinations are proper. For example, the third row where $P_1>P_2$, $P_3>P_1$ and $P_2>P_3$ is not proper because, if $P_1>P_2$ and $P_3>P_1$, $P_2$ cannot exceed $P_3$.

Figure 4:
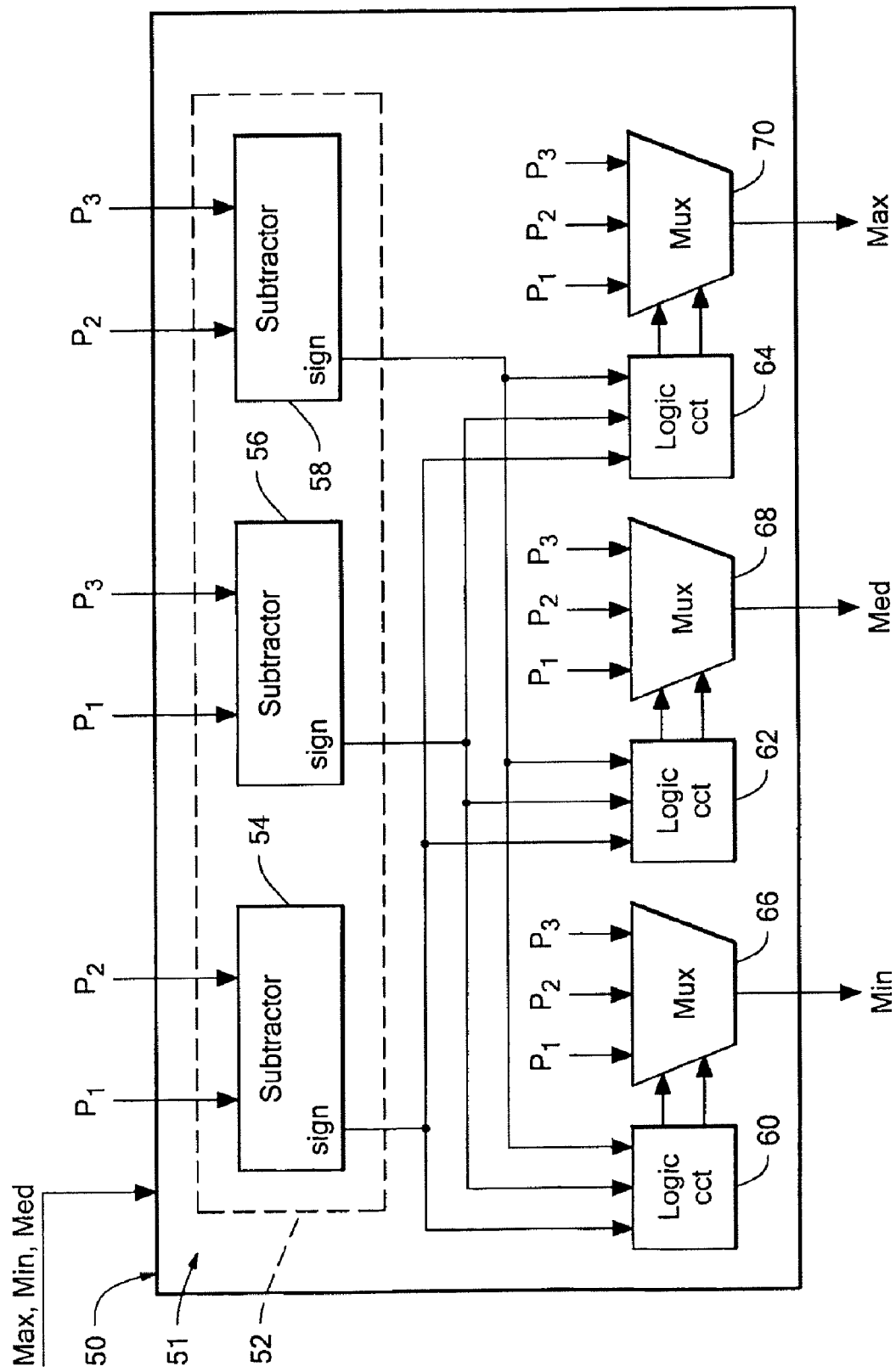
FIG. 4 is a schematic diagram of a portion of a filtering core unit in a processor functioning as a median filter according to an illustrative embodiment of this invention.

FIG. 4 depicts an illustrative embodiment of the invention, where a filtering core unit 50 includes a median filter 51 that itself includes a core-resident comparing circuit 52, which comprises one comparator for each pair of inputs. Those comparators may be, for example, subtractors 54, 56, 58, one for each possible combination of the pairs of inputs, $P_1$ $P_2$; $P_1$ $P_3$; and $P_2$ $P_3$, respectively. There are many different ways that the comparison can be implemented but in this case, using subtractors, it can be simply accomplished by outputting the sign of the subtraction. For example, if subtractor 54 outputs a plus (+) sign, then $P_1$ is greater than $P_2$; if subtractor 54 outputs a minus (−) sign, $P_2$ is greater than $P_1$. These plus and minus signs are delivered from all three subtractors 54, 56, 58 to a core-resident decision circuit including logic circuits 60, 62, 64. The subtractors and logic circuits represent the decision circuits which identify the Min, Med and Max. When the logic circuits 60, 62, 64 recognize a pattern apparent from the truth table of FIG. 3, they pass through the associated multiplexer (mux) 66, 68, 70 the appropriate ones of inputs $P_1$, $P_2$, $P_3$. For example, if the first row of the truth table in FIG. 3 is true, that is, each of the subtractors 54, 56, 58 outputs a plus sign, then logic circuit 60 will cause mux 66 to pass input $P_1$ but not inputs $P_2$ and $P_3$; logic circuit 62 will cause mux 68 to pass input $P_2$ but not inputs $P_1$ and $P_3$; and logic circuit 64 will cause mux 70 to pass input $P_1$ but not inputs $P_2$ and $P_3$. One important advantage of this approach is that instantaneously upon the appearance of the inputs $P_1$, $P_2$ and $P_3$ at filtering core unit 50, the outputs can be immediately generated from muxes 66, 68 and 70: one cycle is all that is required as contrasted with the three cycles in conventional devices.

A second problem can be addressed by embodiments of the present invention at the cost of only one more cycle by decomposing the instructions which operate filtering core unit 50. This problem arises from the fact that most processors have filtering core units whose result bus is only half the size of the input bus. Typically, for example, the input bus can accommodate two 16-bit numbers for multiplication, resulting in one 16-bit product. In the present context, however, three inputs of whatever size (four bits, eight bits, 16 bits, etc.) are sorted and result in three similar outputs. To solve this problem, this invention decomposes the median filter instructions into two pipeline-independent instructions.

Figure 5:
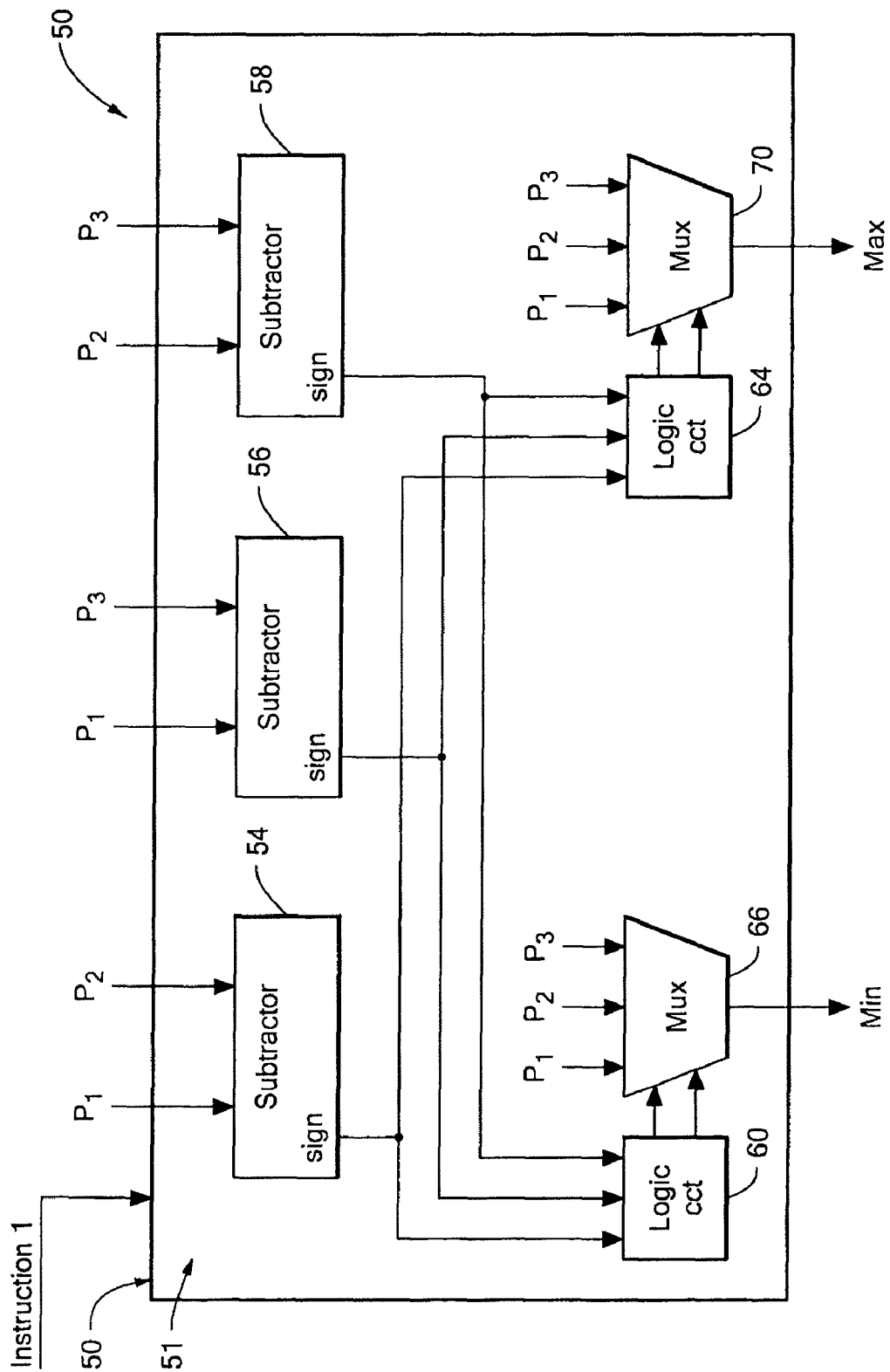
FIGS. 5 and 6 are views similar to FIG. 4 showing a two-step technique using pipeline independent decomposed instructions to accommodate to conventional processor output bus limitations.
Figure 6:
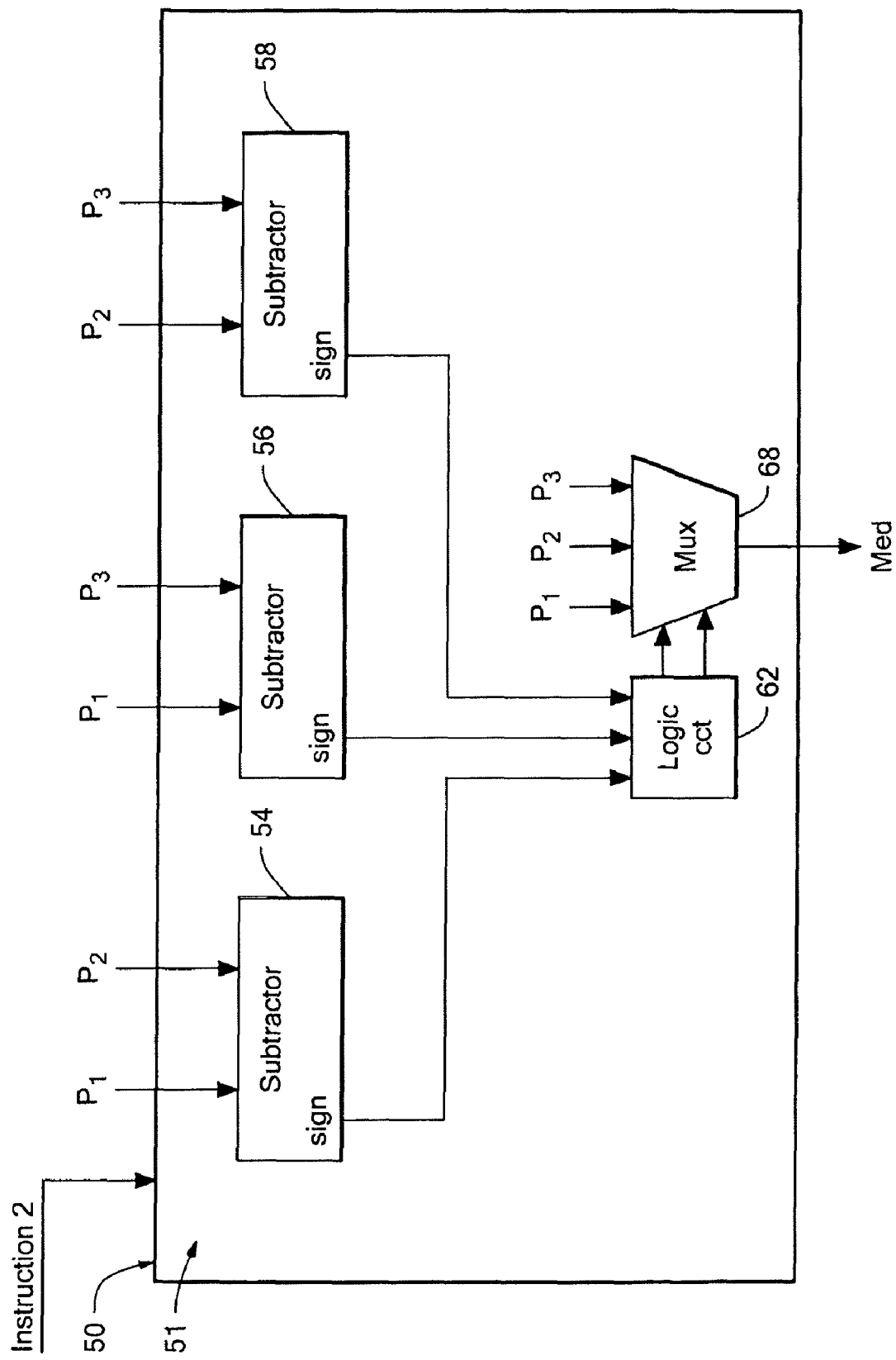

This is shown graphically in FIGS. 5 and 6, where the first instruction delivered to filtering core unit 50 (see FIG. 5) operates subtractors 54, 56, 58, logic circuits 60, 62, 64 and muxes 66, 70, thereby passing on, for example, only the Min and Max signals. On the second instruction (see FIG. 6), mux 68 is enabled to output the Med signal. It does not matter which instruction emerges from any of the outputs: either instruction could result in the output of two of the Min, Med, and Max values, while the next instruction causes output of the remaining one. Thus, the outputs are staggered to accommodate the filtering core unit output bus.

Figure 7:
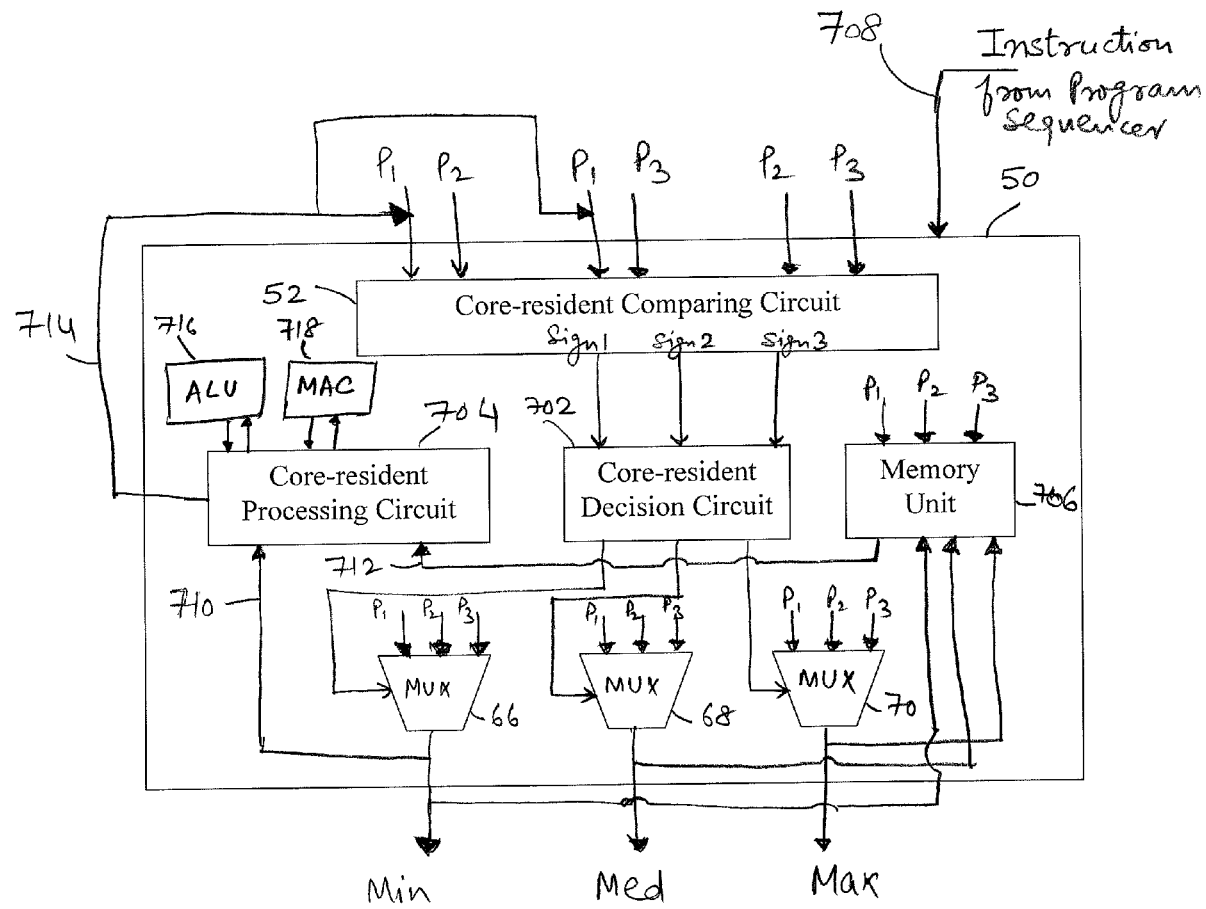
FIG. 7 is a schematic diagram of a portion of a filtering core unit in a processor functioning as a median filter according to another illustrative embodiment of this invention.

FIG. 7 depicts another illustrative embodiment of the invention, where the filtering core unit 50 includes a core-resident comparing circuit 52, a core-resident decision circuit 702, a core-resident processing circuit 704, and a memory unit 706. That is, the comparing, decision and processing circuits reside topologically within the filtering core unit 50. As shown in FIG. 4, the comparing circuit 52 may receive and sort in parallel each combination of pairs of inputs $P_1$, $P_2$, $P_3$ into greater and lesser values, and output the sorted information using signs (i.e., sign 1, sign 2, and sign 3) to the decision circuit 702. The decision circuit 702, including logic circuits 60, 62, 64, determines the Min, Med, and Max values of the inputs $P_1$, $P_2$, $P_3$, and upon receiving one or more instructions 708 from a program sequencer indicates the Min, Med, and Max values at the outputs of filtering core unit 50. The memory unit 706 stores the input values $P_1$, $P_2$, $P_3$, and the Min, Med, and Max values, thereby providing faster access to data processed within the core as compared with memory units that are external to the core unit 50.

In one embodiment, an instruction 708 causes the decision circuit 702 to provide one of the Min, Med and Max values (e.g., the Min value 710) to the core-resident processing circuit 704. The processing circuit 704, in turn, may process the received value 710 alone, or in combination with a value 712 supplied from the memory circuit 706. The processing circuit 704 may operate in conjunction with other core-resident units, such as arithmetic logic unit (ALU) 716 and multiply/accumulator (MAC) 718 to perform operations, such as scaling, thresholding, multiplication, addition, etc. on the received value. In one embodiment, at least one of the processing circuit 704 and the memory unit 706 provides the processed value 714 or the stored value 712 as one of the inputs to the filtering core unit 50 (e.g., to input $P_1$) for filtering in the next cycle with other new inputs.

It will be understood by a person of ordinary skill in the art that the embodiment shown in FIG. 7 is implementable, e.g., in processors in which a core unit output bus can accommodate at least three output values (i.e., Min, Med and Max). If the size of the output bus is not adequate, however, the multi-instruction approach shown in FIGS. 5 and 6 may be used to implement the filtering core unit 50 of FIG. 7. As discussed above, using that approach, multiple instructions from the program sequencer may cause the decision circuit 702 to stagger the values, instead of indicating all the values at the same time, to accommodate the core unit output bus.

Figure 8:
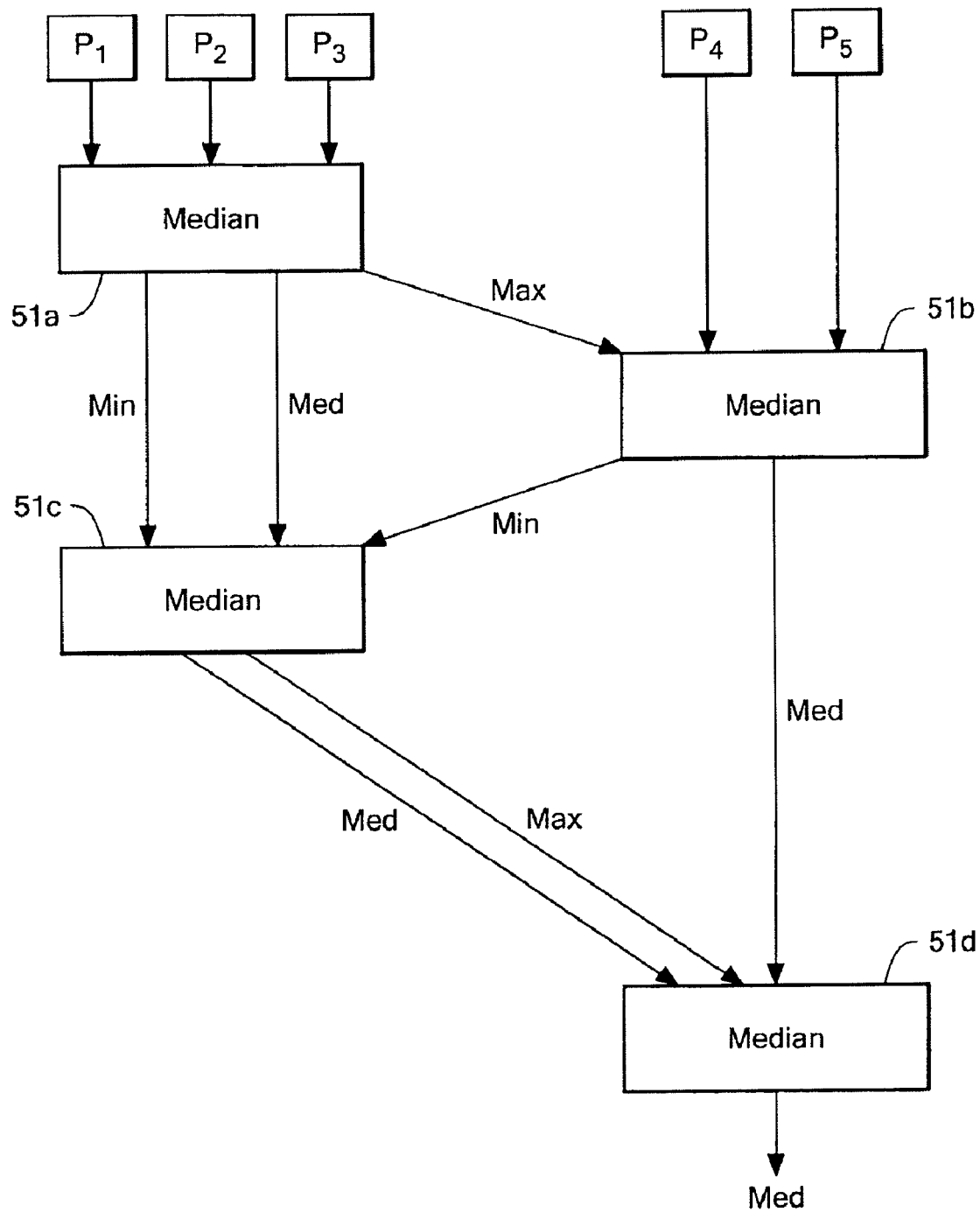
FIGS. 8, 9 and 10 are schematic block diagrams showing median filters similar to FIG. 4 according to this invention for filtering windows or neighborhoods of five, seven and nine inputs, respectively.
Figure 9:
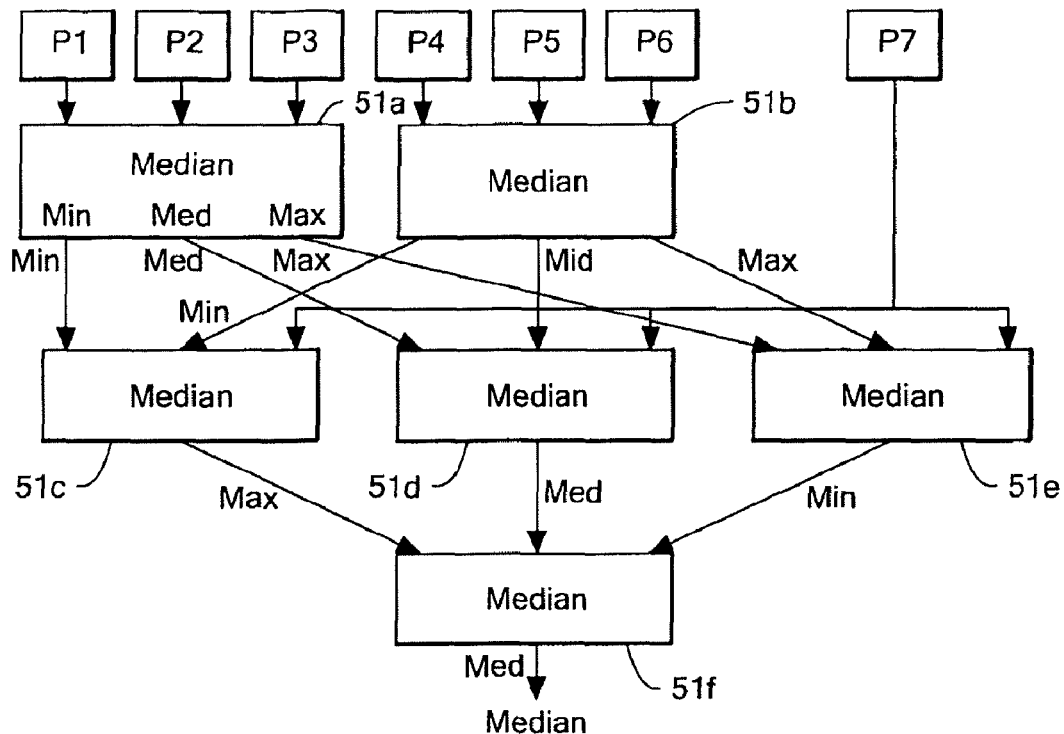
Figure 10:
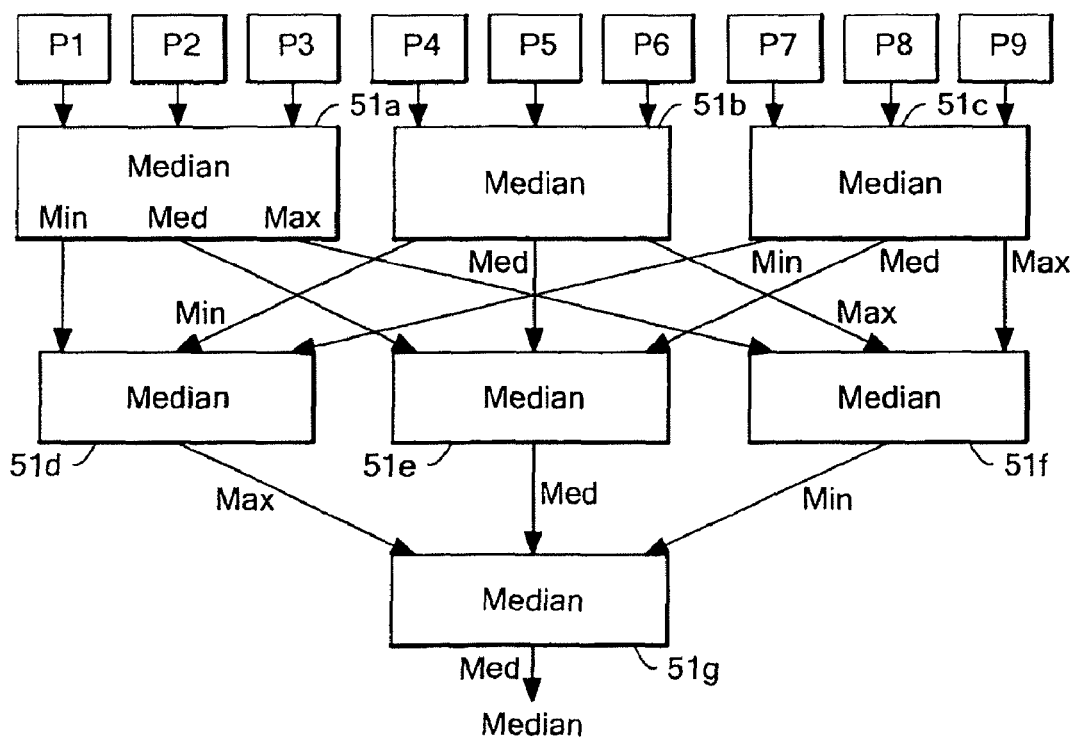

Although the median filter arrangements thus far described respond to three inputs, this is not a limitation of the invention, for by using a plurality of such median filters in the filtering core unit of a processor any number of inputs can be accommodated. For example, FIG. 8 illustrates four median filters, 51*a*-51*d*, all of which reside within the filtering core unit 50 of a processor. Median filter 51*a* sorts $P_1$, $P_2$ and $P_3$ inputs and provides a Max output to median filter 51*b*, and a Min and Med output to median filter 51*c*. Median filter 51*b* sorts the other two inputs $P_4$ and $P_5$ with the Max output of Median filter 51*a*, and provides a Min output to median filter 51*c* and a Med output to median filter 51*d*. Median filter 51*c* sorts the Min and Med outputs of Median filter 51*a* with the Min output of median filter 51*b*, and provides Med and Max outputs to median filter 51*d*, which also receives the Med output from median filter 51*b* to produce the median filter value, Med, at its Med output. Following through further examples in FIG. 9, an arrangement is shown for dealing with seven inputs, $P_1$-$P_7$, using six filters 51*a*-51*f*. FIG. 10 shows a nine input arrangement, $P_1$-$P_9$ using seven median filters 51*a*-51*g*. In each case the median filter is shown as providing only the output necessary to the particular operation, but it should be understood that each is capable of providing the Min, Med and Max outputs.

Figure 11:
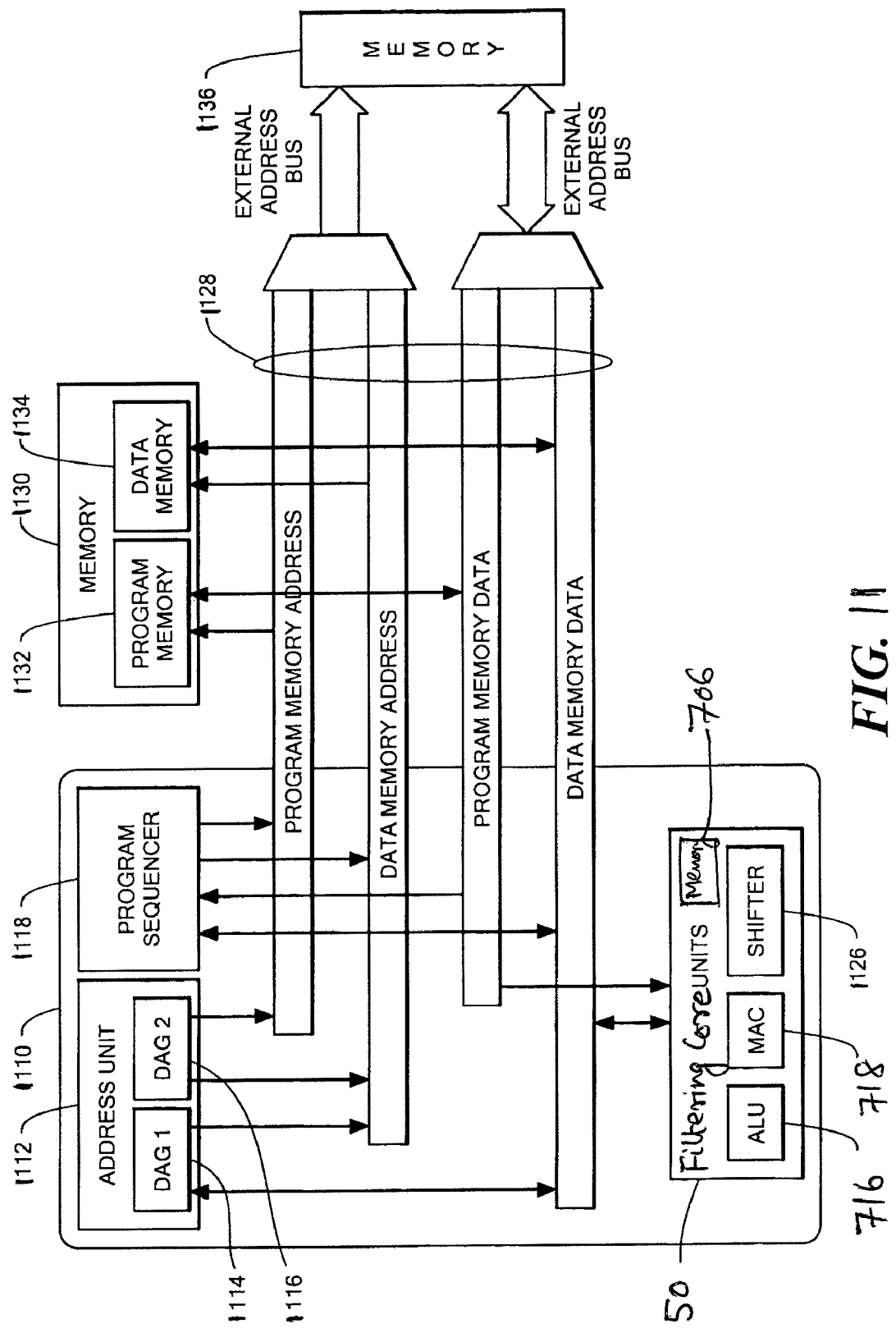
FIG. 11 is a schematic diagram of a processor showing a program sequencer and filtering core unit for implementing this invention.

The median filters can be implemented, as explained previously, in the filtering core unit of a processor. Such a processor is shown as a DSP 1110 in FIG. 11. The DSP 1110 includes an address unit 1112 having one or more data address generators 1114, 1116. A control unit, such as the program sequencer 1118 and one or more filtering core units 50, performs the operations described above. Each of the filtering core units 50 contains circuit elements such as ALU 716, MAC 718, shifter 1126, and memory unit 706. Typically there are a plurality of filtering core units 50 in a single DSP chip. The DSP 1110 is connected over a plurality of memory buses 1128 to one or more memories such as level one (L1) memory 1130 (which includes program memory 1132 and data memory 1134) or additional memory 1136. L1 memory is typically very fast and quite expensive. Memory 1136 may be a level three (L3) memory, which is less expensive and slower. With DSP 1110 operating at 1 GHz and beyond, the operation cycles are so fast that the address unit and the filtering core units require more than one cycle to complete their operations.

To improve DSP 1110 throughput and enhance its performance, it is typically deeply pipelined. A third problem that may be addressed by embodiments of the present invention relates to pipeline dependency, and can be addressed by decomposing the median filter instructions into two parallel, pipeline-independent instructions. In pipelined operations, when there is no dependency between the result of a previous instruction and the subsequent one across all processor parallel building blocks, pipeline efficiencies are preserved. However, if there is such a dependency, the pipeline can stall—that is, the pipeline stops and waits for the offending instruction to finish before resuming to work. Although the processor is herein generally described as a DSP, the approach of the invention can be applied to other processors such as a controller, a MIPS, or an ARM. The decomposed instructions for execution via the program sequencer 1118 invention are reproduced below:

```
// Initial Data Format
//
// L    H   L   H
// 72  58  17  18       R0:R1
//  9  68 118 122       R2:R3
// 120 83  67  97       R4:R5
//
// Algorithm
//
// a b c d e f g h i
//  /\ |/ \|/ \|/
// MinMedMax  MinMedMax  MinMedMax   Level 1
//
//   3 mins      3 Meds      3 maxs
// MinMedMax  MinMedMax  MinMedMax   Level 2
//      \        |        /
//      max     Med      min
//
//      MinMedMax              Level 3
//          |
//         Med
//
// Get the 2 Meddle values of two overlapping 3x3 arrays example code
//
// Level 1 // sort triplets
    r6 = MaxMin(r0, r1.1),   r9 = MaxMin(rl, r0.h);
    r7 = MaxMin(r2, r3.1),  r10 = MaxMin(r3, r2.h);
    r8 = MaxMin(r4, r5.1),  rl1 = MaxMin(r5, r4.h);
  r12.h = Med(r0, r1.1),     r12.1 = Med(r1, r0.h);
   r0.h = Med(r2, r3.1),      r0.1 = Med(r3, r2.h);
   rl.h = Med(r4, r5.1),      r1.1 = Med(r5, r4.h);
// Level 2
// max of the three mins && min of the three maxs
r3:r4 = MaxMin(r6, r7, r8)(v);
// max of the three mins && min of the three maxs
r5:r6 = MaxMin(r9, r10, r11)(v);
// Get the Meds of the three Meds drop into r3.1 and r5.1
r3:r5 = Med(r12, r0, r1)(1o, v);
// Level 3
// r0.h is Med         // r0.1 is Med
R0.h = Med(r3, r4.1),       r0.1 = Med(r5, r6.1);
```

Figure 12:
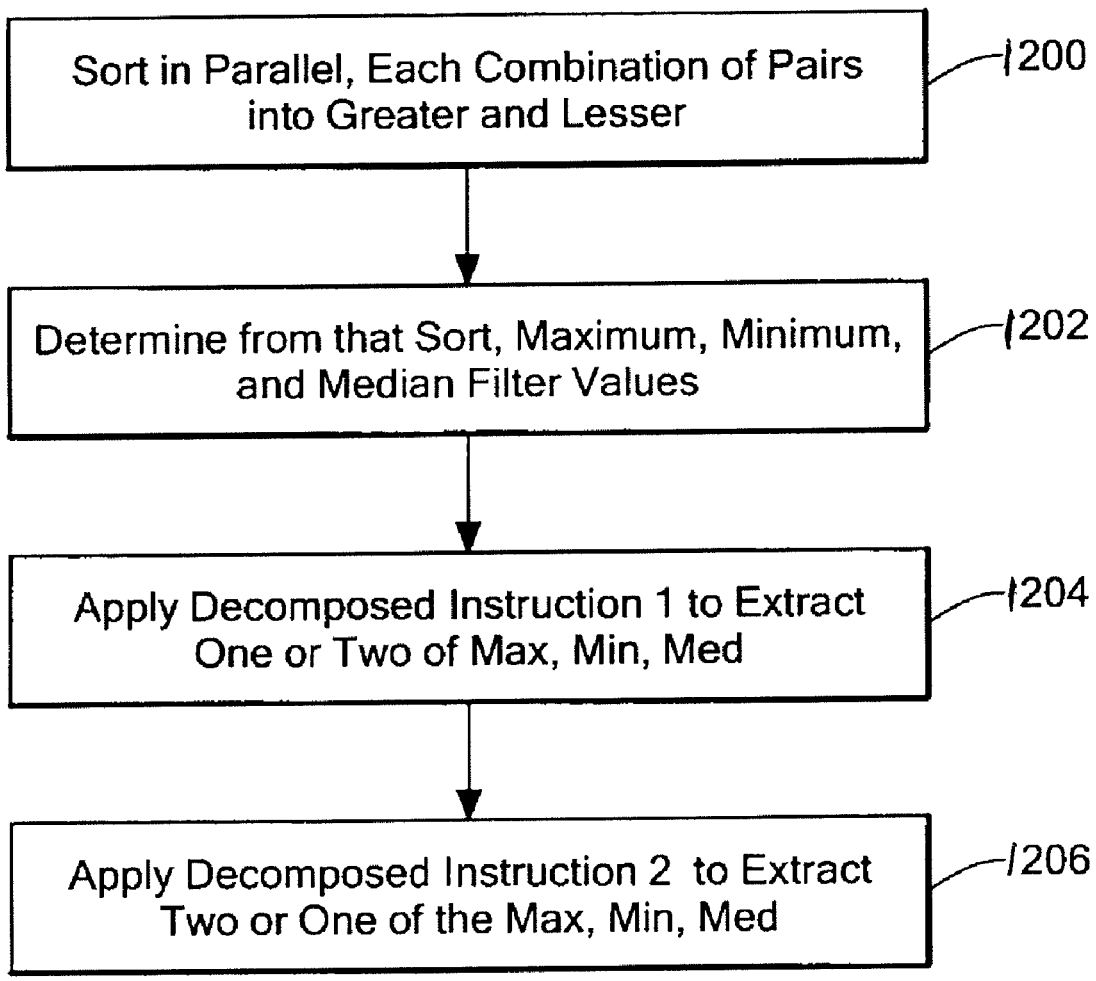
FIG. 12 is a block diagram of the method of this invention.

The invention is not limited to the particular hardware shown or suggested but also encompasses a method carried out in a processor. With reference to FIG. 12, a representative method includes sorting in parallel (step 1200) each combination of pairs into greater and lesser values and determining (step 1202), from that sort, maximum, minimum and median filter values. A final decomposed instruction is applied (step 1204) to extract one or two of the Max, Min, and Med values and then a second decomposed instruction (step 1206) is applied to extract the other remaining two or one of the Max, Min, and Med filter values.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A processor with instruction-based parallel median filtering comprising:
   a filtering core unit for receiving a plurality of inputs, the core including:
      a core-resident comparing circuit for sorting in parallel each combination of pairs of inputs into greater and lesser members;
      a core-resident decision circuit responsive to the sorting of the pairs of inputs to determine the minimum, maximum and median filter values of the inputs; and
      a core-resident processing circuit for processing one of the minimum, maximum and median filter values and providing the processed value as a core unit input; and
   a program sequencer for providing a first instruction for causing the core-resident decision circuit to provide one of the minimum, maximum and median filter values to the core-resident processing circuit, a second instruction for causing the core-resident decision circuit to indicate at least one of those values at a core unit output, and a third instruction for causing the core-resident decision circuit to indicate the others of those values at the output;
   wherein the program sequencer causes the core-resident decision circuit to execute the second and third instructions after the processed value has been provided to the filtering core unit.

2. The processor with instruction-based parallel median filtering of claim 1 in which the filtering core unit further includes a memory unit to store the input values and at least one of the minimum, maximum and median filter values.

3. The processor with instruction-based parallel median filtering of claim 1 in which the comparing circuit comprises a comparator circuit for comparing each pair of the inputs.

4. The processor with instruction-based parallel median filtering of claim 3 in which each said comparator circuit includes a subtractor circuit for subtracting each pair of inputs.

5. The processor with instruction-based parallel median filtering of claim 4 in which greater and lesser members of each pair are indicated by the sign of the differences.

6. The processor with instruction-based parallel median filtering of claim 1 in which the decision circuit includes a logic circuit responsive to the pattern of signs of the differences to indicate the median filter value.

7. The processor with instruction-based parallel median filtering of claim 1 in which the decision circuit includes a logic circuit responsive to the pattern of signs of the differences to indicate the maximum, minimum and median filter values.

8. The processor with instruction-based parallel median filtering of claim 1 in which the program sequencer instructions are independent of a structural pipeline of the filtering core unit.

9. The processor with instruction-based parallel median filtering of claim 1 in which there are three inputs.

10. A method of instruction-based parallel median filtering in a filtering core unit of a processor, the method comprising the steps of:
   sorting, in the core, in parallel each combination of pairs of inputs into greater and lesser values;

determining, in the core, from that sorting minimum, maximum and median filter values of the inputs;

processing, in the core, one of the minimum, maximum and median filter values and providing the processed value as an input to the sorting step; and applying, in the core, a first instruction for providing one of the minimum, maximum and median filter values to the processing step, a second instruction for enabling indication of at least one of those values and a third instruction for enabling indication of the others of those values;

wherein the second and third instructions are applied after the processed value has been provided for sorting.

11. The method of instruction-based parallel median filtering in a filtering core unit of a processor of claim 10 further comprising storing, in the core, the inputs and at least one of the minimum, maximum and median filter values.

12. The method of instruction-based parallel median filtering in a filtering core unit of a processor of claim 10 in which there are three inputs.

13. The method of instruction-based parallel median filtering in a filtering core unit of a processor of claim 10 in which the instructions are independent of a structural pipeline of the filtering core unit.

* * * * *